United States Patent [19]

Mori

[11] Patent Number: 4,798,983
[45] Date of Patent: Jan. 17, 1989

[54] DRIVING CIRCUIT FOR CASCODE BIMOS SWITCH

[75] Inventor: Satoshi Mori, Itami, Japan

[73] Assignee: Mitsubishi Denki Kabushiki Kaisha, Japan

[21] Appl. No.: 53,339

[22] Filed: May 21, 1987

[30] Foreign Application Priority Data

Sep. 26, 1986 [JP] Japan ................. 61-228924

[51] Int. Cl.$^4$ .................. H03K 17/60; H03K 5/00; H03K 3/01; H03K 19/02
[52] U.S. Cl. ..................... 307/570; 307/446; 307/270; 307/544
[58] Field of Search ............ 307/270, 570, 571, 576, 307/577, 579, 584, 585, 446, 451, 575, 544

[56] References Cited

U.S. PATENT DOCUMENTS

| | | | |
|---|---|---|---|
| 3,963,946 | 6/1976 | Zajac | 307/570 |
| 4,551,643 | 11/1985 | Russell et al. | 307/575 |
| 4,651,035 | 3/1987 | Shigekane | 307/571 |

OTHER PUBLICATIONS

Chen, Dan Y. et al, "Bipolar-FET Combinational Power Transistors for Power Conversion Applications", *IEEE*, CH 1855-6/1983, pp. 514-519.

*Primary Examiner*—Stanley D. Miller
*Assistant Examiner*—Trong Quang Phan
*Attorney, Agent, or Firm*—Lowe, Price, LeBlanc, Becker & Shur

[57] ABSTRACT

A driving circuit for driving a cascode bype BiMOS switch which includes a bipolar transistor whose collector is connected through a load to a positive electrode of a power source and a field effect transistor whose drain is connected to an emitter of the bipolar transistor and whose source is connected to a negative electrode of the power source. The driving circuit comprises an n.p series body formed by connecting an n-channel field effect transistor in series relation with a p-channel field effect transistor, wherein a mid-point to the n.p series body is connected to a base of the bipolar transistor. A drain and a source of the n-channel field effect transistor are connected to a D.C. power source and the midpoint, respectively. A drain and a source of the p-channel field effect transistor are connected to the mid-point and the negative electrode of the power source, and a gate of the field effect transistor and gates of the n-channel and p-channel field effect transistors are connected to an input terminal, whereby the cascode type BiMOS switch is driven by a single positive or negative signal.

1 Claim, 1 Drawing Sheet

DRIVING CIRCUIT FOR CASCODE BIMOS SWITCH

BACKGROUND OF THE INVENTION

The present invention relates to a driving circuit for a semiconductor device capable of conducting a switching operation with a high voltage, high current and high speed.

FIG. 2 is a circuit diagram showing an equivalent circuit of a cascode type BiMOS switch 1 as a driven device. Referring to FIG. 2, the cascode type BiMOS switch 1 includes a bipolar transistor 2 whose collector is connected to a collector terminal T1, a power metal-oxide-semiconductor field effect transistor 3 (which will be hereinafter referred to as a power MOSFET) as a field effect transistor whose drain is connected to an emitter of the bipolar transistor 2 and whose source is connected to a source terminal T2, and a free-wheel diode 4 whose cathode is connected to the collector terminal T1 and whose anode is connected to the source terminal T2.

As the power MOSFET 3 is provided for the purpose of power supply, it is selected from n-channel type low-voltage ($V_{DSS} \approx 50V$) low on-resistance devices. The bipolar transistor is an npn power transistor having a high voltage resistance. While the bipolar transistor 2 may be of a Darlington type, it is preferably a single transistor capable of providing a high-speed operation. An emitter terminal of the bipolar transistor 2 is connected to a drain terminal of the power MOSFET 3 to form a series body of the bipolar transistor 2 and the power MOSFET 3.

FIG. 3 is a circuit diagram of a conventional driving circuit for driving the cascode type BiMOS switch 1. Referring to FIG. 3, the driving circuit includes a D.C. power source 5 whose positive electrode is connected through a load 6 to the collector terminal T1 and whose negative electrode is connected to the source terminal T2, a Zener diode 7, an input terminal T3 connected to the base of the bipolar transistor 2, and an input terminal T4 connected to the gate of the power MOSFET 3.

The operation of the driving circuit will be now described. First, in a turn-on operation, positive signals are simultaneously applied to the base of the bipolar transistor 2 and the gate of the power MOSFET 3. In this case, it is necessary to supply a base current dependent on the formula (1) to the base of the bipolar transistor 2.

$$I_c / h_{FE} \leq I_B \quad (1)$$

On the other hand, a gate voltage dependent on the formula (2) is applied to the gate of the power MOSFET 3.

$$I_c / g_m \leq V_{GS} \quad (2)$$

When the two signals satisfying the formulas (1) and (2) are applied, the cascode type BiMOS switch 1 is turned on to deliver current from the D.C. power source 5 through the load 6.

Next, in a turn-off operation, when the signals to both the transistors 2 and 3 are cut off at the same time, the power MOSFET 3 is turned off earlier than the bipolar transistor 2 in general. Accordingly, the emitter of the bipolar transistor 2 is cut off, and a carrier stored in the collector is discharged through the base 2 of the bipolar transistor 2 and the Zener diode 7. Thus, the turn-off operation of the cascode type BiMOS switch 1 is completed.

The conventional driving circuit for the cascode type BiMOS switch 1 has the two signal input terminals T3 and T4, and accordingly, it is necessary to independently carry out current control and voltage control, causing complicated timing of the controls.

SUMMARY OF THE INVENTION

It is an object of the present invention to provide a driving circuit which may drive a cascode type BiMOS switch by a single signal.

It is another object of the present invention to provide a driving circuit which may drive a cascode type BiMOS switch with a low loss.

It is a further object of the present invention to provide a driving circuit which may drive a cascode type BiMOS switch including a field effect transistor in a shortened switching period of time when the field effect transistor is used as a power transistor.

According to the present invention, there is provided a driving circuit for driving a cascode type BiMOS switch including a bipolar transistor whose collector is connected through a load to a positive electrode of a power source and a field effect transistor whose drain is connected to an emitter of the bipolar transistor and whose source is connected to a negative electrode of the power source, the driving circuit comprising an n.p series body formed by connecting an n-channel field effect transistor in series relation with a p-channel field effect transistor, wherein a middle point of the n.p series body is connected to a base of the bipolar transistor, and a drain and a source of the n-channel field effect transistor are connected to a D.C. power source and the middle point, respectively, and a drain and a source of the p-channel field effect transistor are connected to the middle point and the negative electrode of the power source, and a gate of the field effect transistor and gates of the n-channel and p-channel field effect transistors are connected to an input terminal, whereby the cascode type BiMOS switch is driven by a single positive or negative signal.

Other objects and features of the invention will be more fully understood from the following detailed description and appended claims when taken with the accompanying drawings.

DETAILED DESCRIPTION OF THE PREFERRED EMBODIMENT

Figure 1:
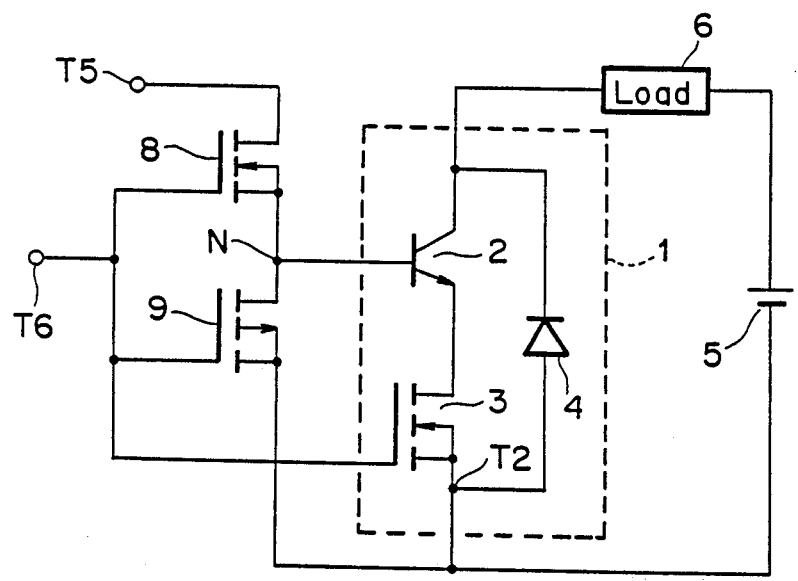
FIG. 1 is a circuit diagram of the driving circuit according to the present invention.
Figure 2:
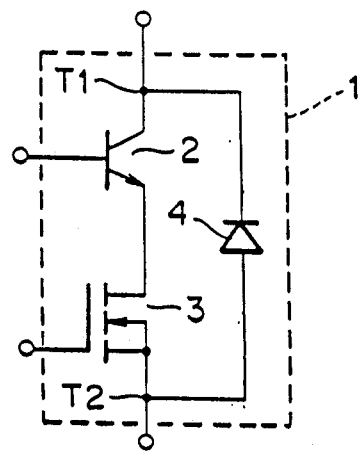
FIG. 2 is a circuit diagram of the cascode type BiMOS switch as a driven device.
Figure 3:
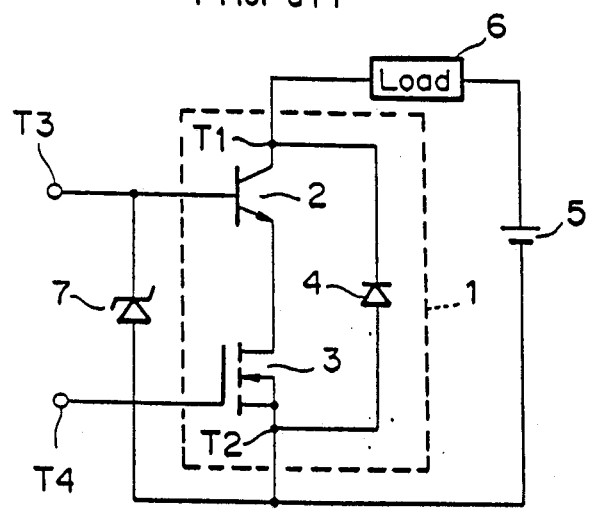
FIG. 3 is a circuit diagram of the driving circuit in the prior art.

Referring to FIG. 1 which shows a circuit diagram of a preferred embodiment according to the present invention, reference numeral 8 designates ann-channel power MOSFET as an n-channel field effect transistor having a drain connected to a D.C. power source terminal T5 of a signal circuit, a source connected to a base of a bipolar transistor 2, and a gate connected to a signal input terminal T6. Reference numeral 9 designates a p-channel power MOSFET as a p-channel field effect transistor having a drain connected to the base of the bipolar transistor 2, a source connected to a source terminal T2, and a gate connected to the input terminal T6. In FIG. 1, parts identical with or corresponding to those previously described with reference to FIG. 3 are denoted by the same reference numerals.

The n-channel power MOSFET 8 is connected in series relation with the p-channel power MOSFET 9 to form an n.p series body. A middle point N of the n.p series body is connected to the base of the bipolar transistor 2. A gate of a power MOSFET 3 of a cascode type BiMOS switch 1 is connected to the input terminals T6.

There will be now described the operation of the circuit as mentioned above. When a positive signal is applied to the signal input terminal T6, the n-channel power MOSFETs 8 and 3 are simultaneously turned on. At this time, the p-channel power MOSFET 9 remains off because the signal is reverse biased. Accordingly, a drain current is delivered from the power source terminal T5 because the n-channel power MOSFET 8 is on. The drain current is changed into a base current of the bipolar transistor 2 on a subsequent stage, thereby turning on the bipolar transistor 2. At this time, since a signal voltage has been already applied to the n-channel power MOSFET 3 connected in series relation with the bipolar transistor 2, the n-channel power MOSFET 3 is also turned on, and a collector current is delivered from a D.C. power source 5 through a load 6 to the bipolar transistor 2. The turn-on operation of the above transistors are firstly carried out in the power MOSFETs 3, 8 and 9, and are finally carried out in the bipolar transistor 2. However, since the bipolar transistor 2 is a single transistor, the turn-on operation thereof is very quickly carried out.

Next, a turn-off operation will be described. In the turn-off operation, the signal voltage is rendered negative. At this time, both the n-channel power MOSFETs 8 and 3 are turned off, and the base current supplied to the bipolar transistor 2 is stopped. Simultaneously, the emitter of the bipolar transistor 2 is cut off because the n-channel power MOSFET 8 is turned off. On the other hand, at the timing when the negative voltage is applied to the signal input terminal T6, the p-channel power MOSFET 9 is turned on, and charge stored in the collector and the base of the npn bipolar transistor 2 under the emitter cut-off condition is discharged from the base of the transistor 2 through the p-channel power MOSFET 9. Thus, the turn-off operation of the cascode type BiMOS switch 1 is completed.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A driving circuit for driving a cascode type BiMOS switch including a bipolar transistor whose collector is connected through a load to a positive electrode of a power source and a field effect transistor whose drain is connected to an emitter of said bipolar transistor and whose source is connected to a negative electrode of said power source, said driving circuit comprising an n.p series body formed by connecting ann-channel field effect transistor in series relation with a p-channel field effect transistor, wherein a mid-point of said n.p series body is connected to a base of said bipolar transistor, and a drain and a source of said n-channel field effect transistor are connected to a D.C. power source and said mid-point, respectively, and a drain and a source of said p-channel field effect transistor are connected to said mid-point and said negative electrode of said power source, and a gate of said field effect transistor and gates of said n-channel and p-channel field effect transistors are connected to an input terminal, whereby said cascode type BiMOS switch is driven by a single positive or negative signal.

* * * * *